United States Patent [19]

Zweig

[11] Patent Number: 4,527,080
[45] Date of Patent: Jul. 2, 1985

[54] DIGITAL PHASE AND FREQUENCY COMPARATOR CIRCUIT

[75] Inventor: Walter L. Zweig, Rockaway, N.J.

[73] Assignee: AT&T Bell Laboratories, Murray Hill, N.J.

[21] Appl. No.: 514,476

[22] Filed: Jul. 18, 1983

[51] Int. Cl.³ .............. H03K 5/153; H03K 12/00; H03K 19/21

[52] U.S. Cl. ................ 307/510; 307/87; 307/514; 307/526; 307/527; 307/269; 328/136; 328/155

[58] Field of Search .............. 307/64, 70, 73, 85, 307/87, 510, 514, 516, 517, 524–529, 521, 262, 269, 271; 328/63, 74, 110, 130.1, 134, 136, 155; 377/47

[56] References Cited

U.S. PATENT DOCUMENTS

| | | | |
|---|---|---|---|
| 3,849,671 | 11/1974 | Molack | 307/514 X |
| 3,857,103 | 12/1974 | Grazia | 307/514 X |
| 3,947,775 | 3/1976 | Thiebaut | 307/516 X |
| 4,246,497 | 1/1981 | Lawson et al. | 307/514 |
| 4,267,514 | 5/1981 | Kimsey | 307/528 X |
| 4,329,653 | 5/1982 | Offermanns | 328/155 |
| 4,354,124 | 10/1982 | Shima et al. | 307/522 |
| 4,362,957 | 12/1982 | Stern | 307/527 |
| 4,381,457 | 4/1983 | Wiles | 307/64 |

Primary Examiner—Stanley D. Miller
Assistant Examiner—D. R. Hudspeth
Attorney, Agent, or Firm—Alfred G. Steinmetz

[57] ABSTRACT

A digital phase and frequency comparator circuit establishes phase and frequency windows to determine if two AC signals are in phase and of substantially the same frequency. A phase difference between the two signals is determined by exclusively ORing the two signals and timing the duration of a signal state to determine if the phase difference exceeds a threshold. The two AC signals are also ANDed and counted to determine the frequency agreement.

9 Claims, 5 Drawing Figures

4,527,080

DIGITAL PHASE AND FREQUENCY COMPARATOR CIRCUIT

TECHNICAL FIELD

This invention relates to digital circuitry for phase and frequency comparison of two unsynchronized alternating current signals and, in particular, to a phase and frequency comparator circuit suitable for use in a load transfer circuit where a load is transferred from one primary AC power source to another independent AC power source.

BACKGROUND OF THE INVENTION

AC transfer circuits are switching arrangements that permit a load to be transferred from one power source to another independent power source. Their purpose in transferring the load is to assure continued power to the load by disconnecting it from a failed power source and reconnecting it to an active power source. Normally, the load is powered by some primary AC power source such as a commercial power line and when commercial power fails, the load is transferred to a reserve AC power source which normally comprises a battery energized static inverter circuit. When commercial power is restored, the load is reconnected to the commercial AC line. Since the two power signals are not synchronized, i.e., the line and reserve signals are normally not in phase, the reconnection is not permitted until the two signals are in substantial phase agreement in order to avoid large transients when reconnecting to the AC line. Substantial phase coincidence is considered to have occurred when some common feature of the signal such as a zero crossing of the two signals is less than some small time interval apart, otherwise known as within a phase time window. This arrangement does not, however, determine if the two signals are at substantially the same frequency and hence a transfer could occur even if the two signals are not matched in frequency.

A suitable comparator circuit for such an application should define a precise phase and frequency time window which is operative to permit a load transfer only when two drifting signals of only slightly different frequencies are in substantial phase and frequency coincidence.

SUMMARY OF THE INVENTION

Therefore, a comparator circuit embodying the principles of the invention establishes a phase and frequency time window for determining if two signals that are square wave equivalents of two AC signals are in phase and have substantially similar frequency.

The digital phase and frequency window comparator circuit disclosed herein for use in an AC transfer circuit provides a signal output to permit transfer between a primary and reserve source when their respective signals are within a predefined phase and frequency window.

The two signals to be compared are converted to square waves and applied to an exclusive OR gate and to an AND gate. The output of the exclusive OR gate is applied to periodically retrigger a monostable circuit whose output is enabled when the two signals are outside the phase window and which is used to clear a counter connected for counting a pulse output of the AND gate. When the two signals are in substantial phase agreement, the counter is allowed to accumulate a count. When a threshold count is attained, the conditions of the frequency window are met and an AC transfer from one source to another is permitted.

BRIEF DESCRIPTION OF THE DRAWING

An appreciation of the invention may be attained by examination of the following specification and the accompanying drawing in which.

DETAILED DESCRIPTION

Figure 1:
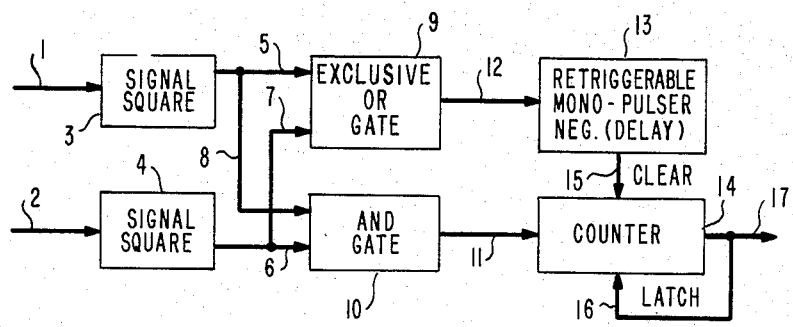
FIG. 1 is a block diagram of a phase and frequency comparator circuit embodying the principles of the invention.

A phase and frequency comparator circuit as shown in FIG. 1 is operative to determine if two AC signals applied, respectively, to input leads 1 and 2 are similar enough in phase and frequency to supply a control signal state on lead 17 utilized in an AC transfer circuit for enabling a load transfer from one AC signal source to another source. Normally, a reserve AC signal of a static inverter is coupled to input lead 1 and an AC line signal is coupled to input lead 2. The two signals are converted into rectangular wave signals by the signal squaring circuits 3 and 4. These rectangular output signals, shown as waveforms 20 and 21 in FIG. 3, have trailing and leading edges coincident with the zero crossings of the input AC signals. The rectangular waveform signals are both applied, via leads 5 and 7, to an exclusive OR gate 9. Exclusive OR gate 9 responds to the rectangular input signal by producing a low state pulse output signal 22 when the rectangular signals have opposite high and low states and a high state output 23 when the rectangular signals have identical states. The two rectangular waves are additionally coupled, via leads 6 and 8, to an AND gate 10 whose output reflects the coincidence of the two signal states.

Figure 3:
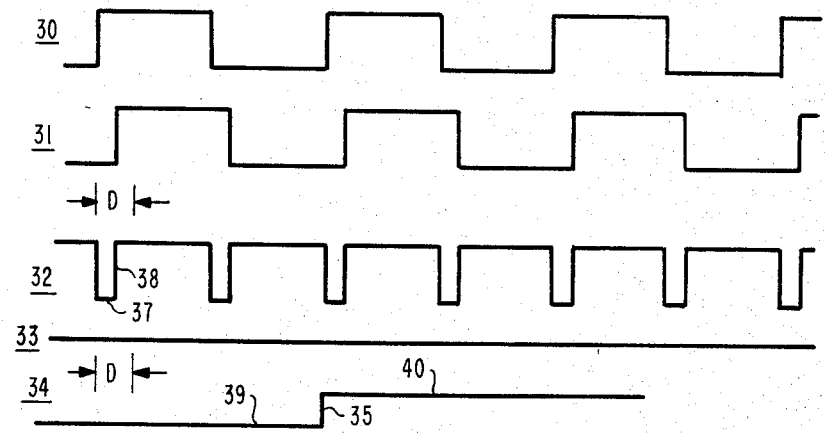

The output waveform 24 of the exclusive OR gate 9 is coupled, via lead 12, to a retriggerable monopulse circuit 13 which responds to an input pulse with a positive going edge 25 to produce an immediate low output pulse state 26 value on lead 15; alternatively a delayed high state output 27 on lead 15 is generated in response to a negative going leading edge 28 unless a positive going pulse is applied to the input before a preset delay period expires. Due to the delay (designated 'D') which is fixed by the timing circuit of the monopulse circuit 13, if a positive going edge is applied to the input following a negative going edge within a time interval less than the value 'D', no high state output value 27 will be produced by the monopulse circuit 13. This particular state may be readily ascertained by examining the waveforms 32 and 33 in FIG. 3 representing the exclusive OR value of waveforms 30 and 31 and the output of monopulser 13. Here the duration of the low state 37 of waveform 32 is less than the preset delay time interval 'D' and hence no high state value is produced on lead 15.

The pulse output of AND gate 11 is applied to counter 14. This output pulse is counted by counter 14. This count represents the number of consecutive times that the two square wave signals are within the phase window. A threshold count is set which establishes the frequency window for these two square wave signals. When the threshold count is reached, an output signal state appears on lead 17 which is utilized as a control signal to enable an AC transfer of the load. The output of the monopulse circuit 13 is applied, via lead 15, to a clear input of counter 14 and is operative to reset the counter 14 to zero, if the two signals are significantly different in frequency since as described above, a clear pulse signal is generated.

Figure 2:
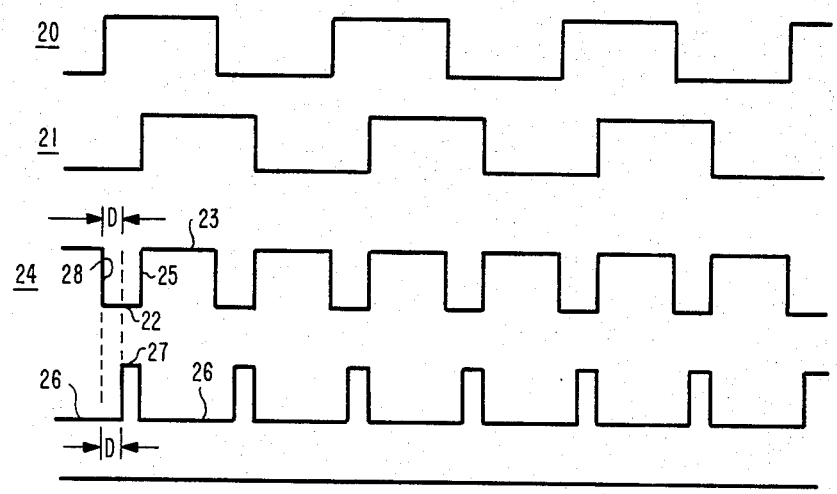
FIGS. 2 and 3 are voltage waveforms for assisting in explaining the operation of the circuit of FIG. 1.

The principles of the invention may be readily understood by describing the operation of the circuit in FIG. 1. As indicated above, the two sinusoidal input signals on leads 1 and 2 are squared by squaring circuits 3 and 4, respectively. These signals, shown as rectangular waveforms 20 and 21 in FIG. 2, represent the phase relation of two sinusoidal signals substantially out of phase. These signals are both applied to the exclusive OR gate 9 which produces a negative output pulse whose duration at the low state 22 is directly proportional to the phase difference between the two AC signals being monitored. The negative going edge 28 of the pulse is applied, via lead 12, to trigger the monopulser 13. As indicated above, its response to a negative going pulse at the output 15 is delayed by a delay time 'D'. In the waveforms of FIG. 2, the low state 22 lasts longer than the time 'D' and in this immediate illustrative example, a pulse 27 is produced at the output and applied by lead 15 to clear counter 14.

While the AND gate produces a pulse every time waveform 20 and 21 assume the same positive state, counter 14 can accumulate no count since it is cleared in response to pulse 27 which is generated every half cycle of the input signal. Hence no enabling signal state is applied to lead 17 to allow a transfer of the load to occur.

When the two signals applied to input leads 1 and 2 are very close in phase as shown by squared waveforms 30 and 31 in FIG. 3, the negative pulse output of exclusive OR gate 9 is at a low state 37 for a period of time substantially less than the delay time 'D'. The positive going pulse edge 38 at the end of the low state 37 occurs before the expiration of 'D' and hence the output of the monopulse circuit 13 remains at its low state, and no generated pulse appears on lead 15 with the result that counter 14 is not cleared. Counter 14 accumulates a count in response to the pulse output of AND gate 10 and when a preset threshold count is attained, the output signal state of counter 14 on lead 17 assumes a high state as shown by waveform 34 where a positive going transition to high state 40 occurs at leading edge 35 from a low state 39. This high state is fedback on lead 16 to latch the counter to maintain the high state 40 for a duration sufficient to permit the load transfer to occur.

Figure 4:
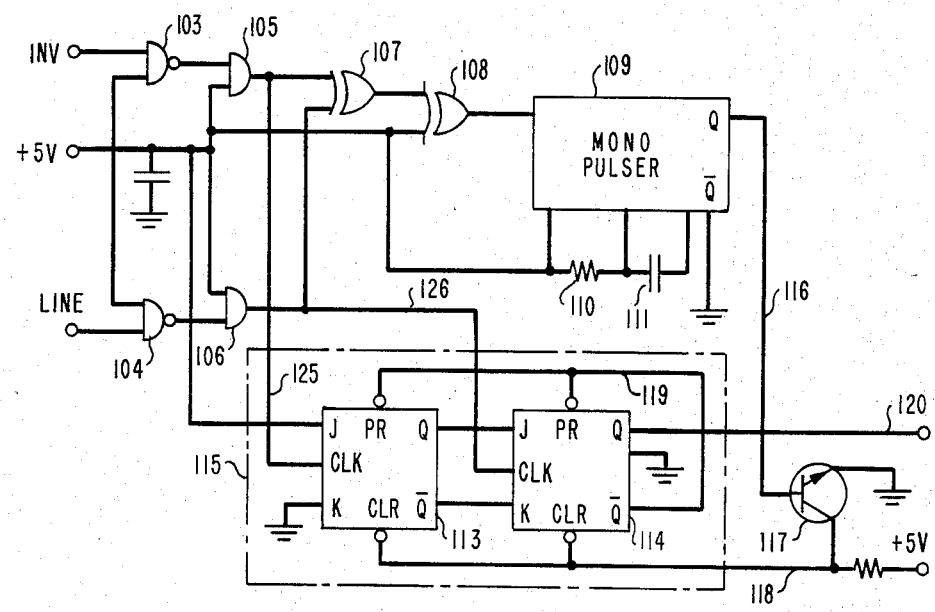
FIG. 4 is a schematic of an illustrative embodiment of the circuit of FIG. 1.

The phase and frequency comparator is disclosed in schematic form in FIG. 4, in which, the individual logic circuits are disclosed. Both of the AC signals being monitored from the line and inverter are each coupled to NAND Schmitt trigger circuits 103 and 104, respectively, which are used to sharply define zero crossings of the input AC signals. The output waveforms of the Schmitt trigger are buffered through the AND gate 105 and 106 to improve the sharpness of the rise and fall times. The respective outputs of AND gates 105 and 106 are shown by waveforms 171 and 172 in FIG. 5, which represent the phases of the inverter and AC line sinusoidal voltages. The waveforms 171 and 172 are applied to the first exclusive OR gate 107, whose output is applied to a second exclusive OR gate 108 and exclusively ORed with a 5 volt bias voltage. The output of exclusive OR gate 108 is shown as waveform 173 in FIG. 5 and is such that whenever waveforms 171 and 172 are at the same logic level, the output of exclusive OR gate 108 is a high state. Conversely whenever the two waveforms 171 and 172 are at different logic levels, the output state, as shown in waveform 173, is low. Therefore, the low state duration of waveform 173 represents the time duration of a phase mismatch of waveforms 171 and 172.

The pulse output of exclusive OR gate 108 is applied to a monostable time delay circuit 109 which produces pulse outputs whose duration is determined by external timing circuit components 110 and 111. This timing circuit provides a fixed delay in the response of a logical zero output in response a negative going edge of a pulse signal input. No delay in output is incurred for positive going pulse signals. If, however, the duration of the negative going pulse is less than a preset delay time 'D' in duration (i.e., that a positive going edge occurs before delay 'D' has expired) no logical zero output responsive to the initial negative going pulse is produced. The waveform 174 in FIG. 5 shows the zero level output that occurs when input pulse 173 exceeds the delay time 'D'.

This preset delay period defines a phase window which enables a determination that the two waveforms 171 and 172 are apart in phase by more or less than the delay period. If they do not differ by more than the preset time delay, they are considered to be in phase as occurs in the center region 184 of waveform 174, no zero logic state output is produced. If they do differ by a greater amount, they are considered to be out of phase.

Figure 5:
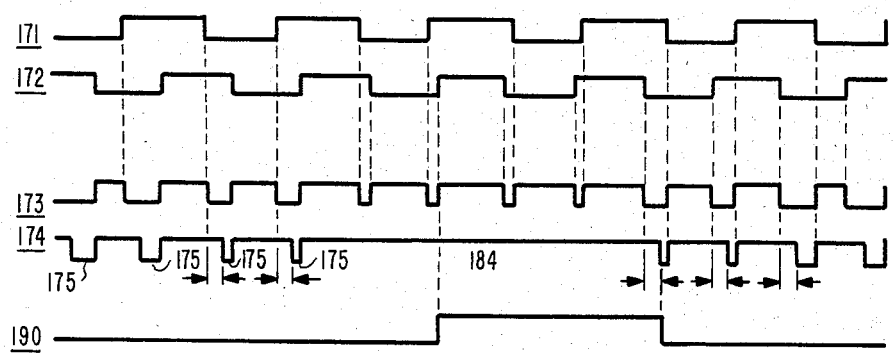
FIG. 5 discloses signal waveforms of the circuit of FIG. 4.

Normally the two waveforms 171 and 172 are at slightly different frequencies which is the case illustrated in FIG. 5. Hence a transfer may be made only when the frequency difference as well as the phase difference is less than threshold or window value. An in-phase period that occurs for a preset consecutive number of times is considered to represent a frequency window, the width of which is controlled by a count accumulated by a counter 115 comprising the JK flip-flops 113 and 114.

The two stage counter 115 comprising flip-flops 113 and 114, both of which are responsive to positive going pulses, is used to determine if the two waveforms 171 and 172 are in phase as defined by the phase window for a consecutive number of times which number defines the frequency window. In the illustrative embodiment, this in-phase condition must be achieved three consecutive times to satisfy the frequency window. Counter 115 (i.e., flip-flops 113 and 114) is cleared in response to an output of the monopulser on lead 116 as amplified by transistor 117 and inverted to clear input by lead 118 if an out-of-phase condition occurs before the preset accumulated count is attained.

The counter 115 counts in response to the output of AND gates 105 and 106 coupled, respectively, via leads 125 and 126, to the clock inputs of JK flip-flops 113 and 114. A clocking pulse is generated by the AND gates 105 and 106 when the rectangular waveforms 171 and 172 are at high level states. The monopulser 109 generates an output clear pulse 175 to reset the counter whenever the two rectangular waveforms 171 and 172 are of opposite logic states for a time interval equal to or exceeding the preset delay interval 'D'. Hence an AC transfer enabling signal level or output lead 120 cannot be generated until three successive pulses have been counted by counter 115 in the absence of any intervening clear pulse on lead 116.

A feedback signal on lead 119 latches the counter once a satisfactory AC transfer state has been achieved. The enabling output signal level on lead 120 is shown by waveform 190 and is utilized by switching circuitry to enable the AC transfer.

What is claimed is:

1. A phase and frequency coincidence comparator comprising
   first means for ascertaining phase agreement of two AC signals determining if a difference in phase between the two signals is less than a preset time interval
   second means for ascertaining frequency acceptance by determining if phase agreement has occurred a preset consecutive number of times, and
   third means responsive to the second means for signaling concurrence of phase agreement and frequency acceptance.

2. A phase and frequency coincidence comparator as defined in claim 1 wherein the first means includes an exclusive OR gate coupled to sense the two AC signals and a time delay monopulser responsive to an output of the exclusive OR gate and operative for generating a pulse if the preset time interval is exceeded by a difference in phase or time of the two signals.

3. A phase and frequency coincidence comparator as defined in claim 2 wherein the second means includes counting means for counting successive occurrences of phase agreement and the counting means including clear accumulater count input means responsive to a pulse output of the monopulser.

4. A phase or frequency coincidence comparator as defined in claim 3 and further including means for squaring the two AC signals prior to application to the exclusive OR gate.

5. A phase and frequency coincidence comparator as defined in claim 4 further including AND gate means coupling the means for squaring to the counting means.

6. A frequency and phase comparator comprising
   first means for squaring an AC line voltage,
   second means for squaring an AC reserve voltage,
   AND gate means for ANDing outputs of the first and second means,
   counting means responsive to an output of the AND gate means by accumulating a count, and providing an output when a threshold count is attained,
   exclusive OR gate means for exclusive ORing outputs of the first and second means,
   pulse generation means responsive to an output of the exclusive OR gate means, the pulse generation means having a property of generating an output pulse only if an input pulse of one polarity supplied from the exclusive OR gate means exceeds a preset time duration,
   means for utilizing an output of the pulse generation means to clear the counting means of an accumulated count, and
   output means for signaling attainment of the threshold count in the counting means.

7. A frequency and phase comparator as defined in claim 6 wherein the counting means includes at least first and second JK flip-flops connected in a cascade arrangement.

8. A frequency and phase comparator as defined in claim 7 wherein the means for utilizing includes a transistor amplifying device.

9. A frequency and phase comparator as defined in claim 8 wherein the pulse generation means includes a timing circuit for controlling the preset time duration.

* * * * *